United States Patent [19]
Fujihira

[11] Patent Number: 5,182,218
[45] Date of Patent: Jan. 26, 1993

[54] PRODUCTION METHODS FOR COMPOUND SEMICONDUCTOR DEVICE HAVING LIGHTLY DOPED DRAIN STRUCTURE

[75] Inventor: Mitsuaki Fujihira, Yokohama, Japan

[73] Assignee: Sumitomo Electric Industries, Ltd., Japan

[21] Appl. No.: 837,891

[22] Filed: Feb. 20, 1992

[30] Foreign Application Priority Data

Feb. 25, 1991 [JP] Japan .................. 3-029967
May 17, 1991 [JP] Japan .................. 3-113116

[51] Int. Cl.$^5$ .......................... H01L 21/265
[52] U.S. Cl. .......................... 437/22; 437/41;
437/44; 437/912; 437/944; 148/DIG. 100;
257/282
[58] Field of Search ............. 437/41, 44, 944, 912,
437/22; 148/DIG. 100, 143; 357/22 I

[56] References Cited

U.S. PATENT DOCUMENTS 4,472,872  9/1984  Toyoda et al. .................. 437/41
4,509,991  4/1985  Tour ................................ 437/34
4,855,246  8/1989  Codella et al. ................. 437/41

*Primary Examiner*—Olik Chaudhuri
*Assistant Examiner*—Long Pham
*Attorney, Agent, or Firm*—Beveridge, DeGrandi & Weilacher

[57] ABSTRACT

The present invention relates to a method of making a compound semiconductor device having a high performance self-aligned LDD structure which has stable characteristics, and is suitable for high integration and high yield, in which after forming a channel layer beneath the substrate surface, using a high performed self-aligned technology, a gate electrode, lightly doped layers and heavily doped layers are formed in predetermined positions by a photolithography for the gate portion. This process of a photolithography is performed only once, therefore, each pattern can be formed with excellent accuracy and reproducibility.

14 Claims, 9 Drawing Sheets

PRODUCTION METHODS FOR COMPOUND SEMICONDUCTOR DEVICE HAVING LIGHTLY DOPED DRAIN STRUCTURE

BACKGROUND OF THE INVENTION

1. Field of the Invention

The present invention relates to production methods for a compound semiconductor device. In particular, it relates to production methods for a MESFET (a Schottky's FET) including a self-aligned process.

2. Related Background Art

A production method for a MESFET in which a compound semiconductor is used as a material, for example, is described in U.S. Pat. No. 4,636,822. In this document, MESFET having an LDD (lightly doped drain) structure is disclosed as shown in FIGS. 1A to 1C, FIGS. 2A to 2C and FIGS. 3A and 3B. Its production method is explained hereinafter.

Figure 1A:
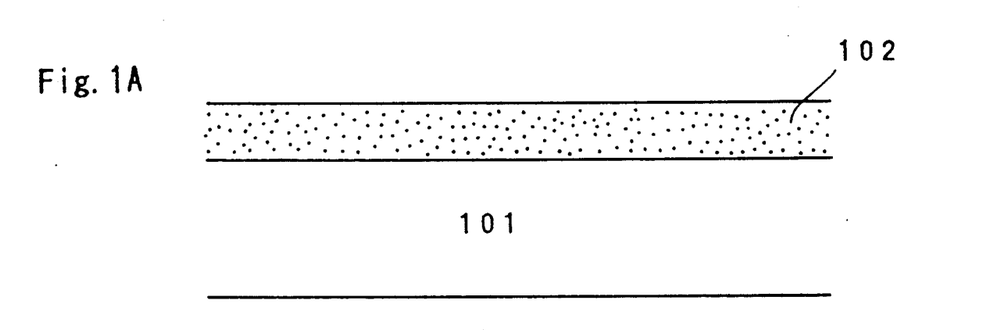
FIG. 1A to FIG. 1C, FIG. 2A to FIG. 2C and FIG. 3A to FIG. 3B show the production steps of the convention compound semiconductor device.
Figure 1B:
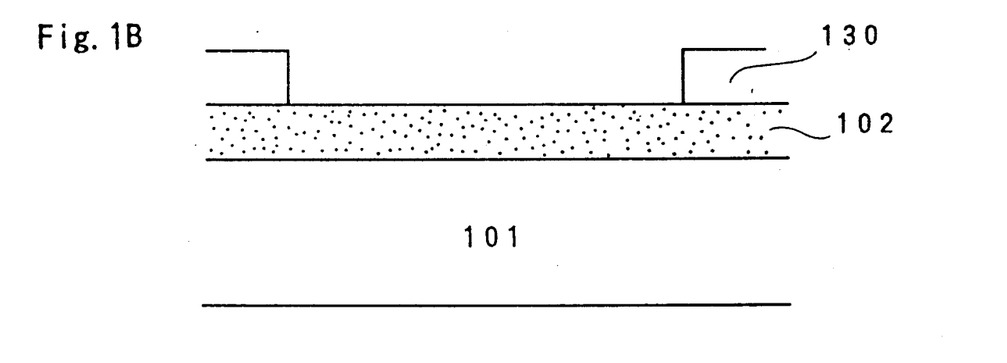
Figure 1C:
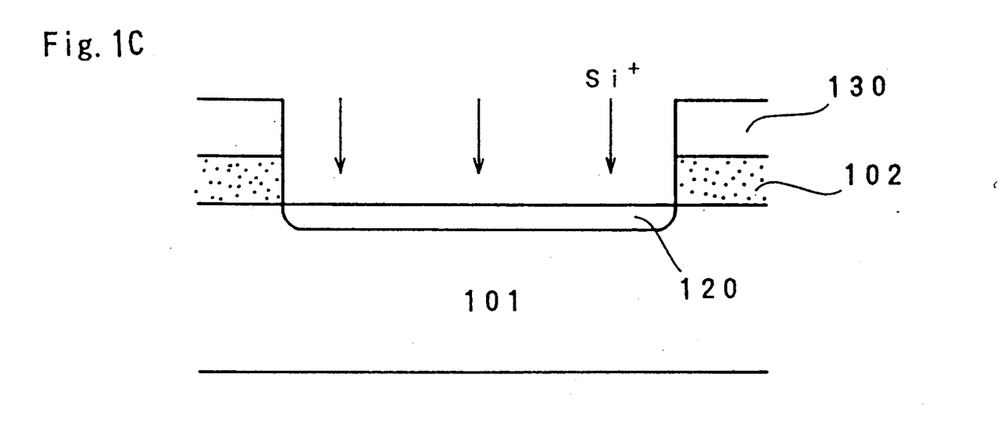

For example, on a compound semiconductor substrate 101 composed of semi-insulated GaAs(gallium arsenide), an insulated layer(silicon nitride layer) 102 to separate the element, such as SiN (silicon nitride) layer or the like, is formed (FIG. 1A), and a first resist pattern 130 having an opening at an element region is formed on the insulated layer 102 (FIG. 1B). Next, a part of the insulated layer 102 corresponding to the opening of the first resist pattern 130 is etched by RIE (reactive ion etching), and ion implantation is performed to form a channel layer 120 (FIG. 1C).

Figure 2A:
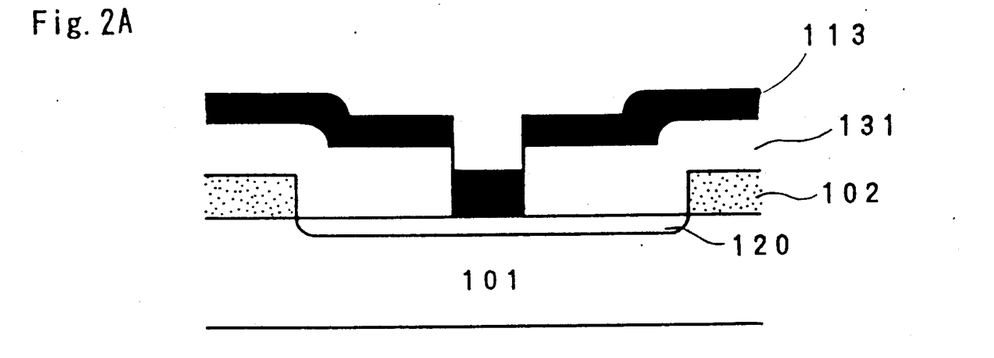

Next, after removing the first resist pattern 130 a second resist pattern 131 with an opening only at a portion, where a gate electrode is formed, is formed on the substrate 101 and the insulated layer 102. And thereafter, a gate electrode material 113 is uniformly evaporated or vapor-deposited on the substrate 101 exposed by the opening and the second resist pattern 131 (FIG. 2A). As the gate electrode material 113, it is exemplified by metals having a high melting point such as, for example, W(tungsten), Mo(molybdenum), and Ti(titanium) and silicides thereof.

Figure 2B:
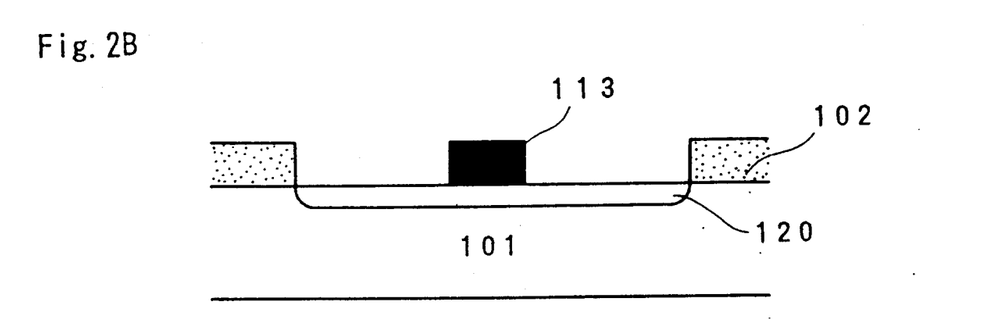

Next, the second resist pattern 131 to form a gate electrode is removed, simultaneously the gate electrode material 113 at unnecessary portions is also subjected to lift-off (FIG. 2B). Incidentally, the gate electrode 113 is formed by means of the lift-off method as an example, however, it is also possible to form it by an etching method.

Figure 2C:
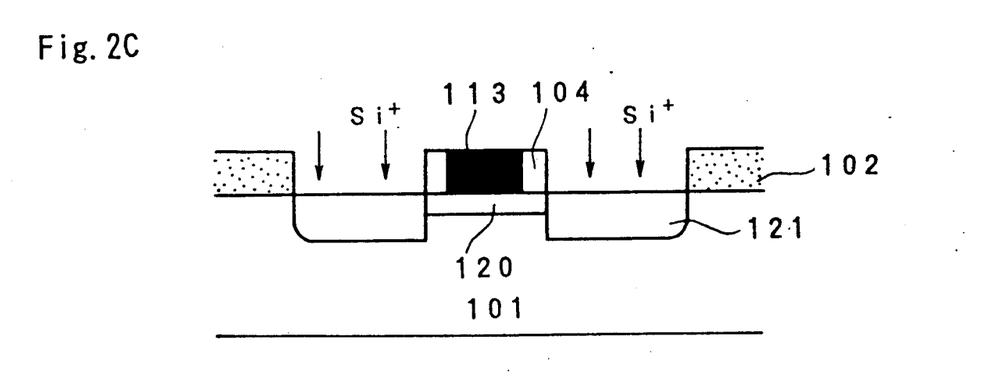
Figure 3A:
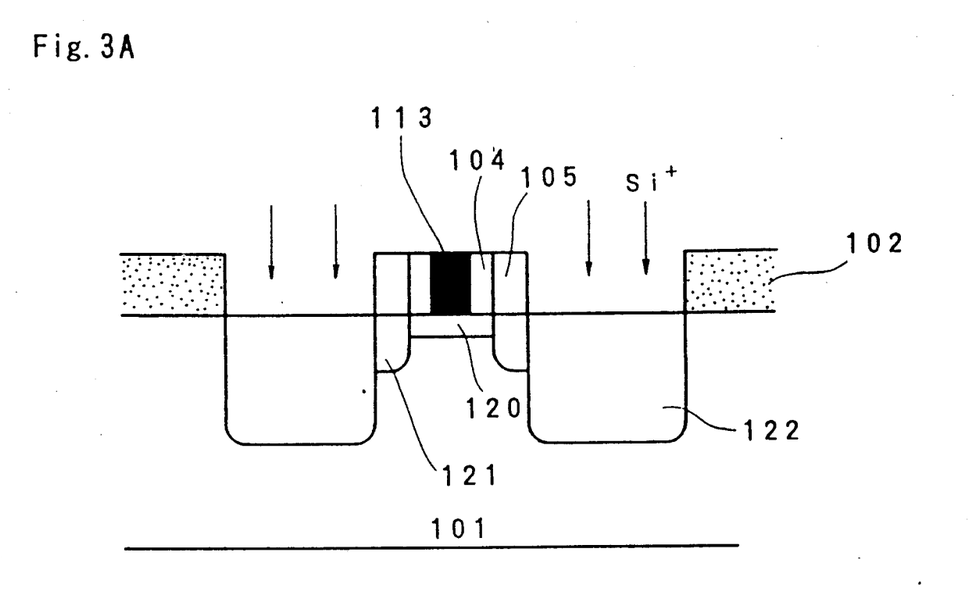
Figure 3B:
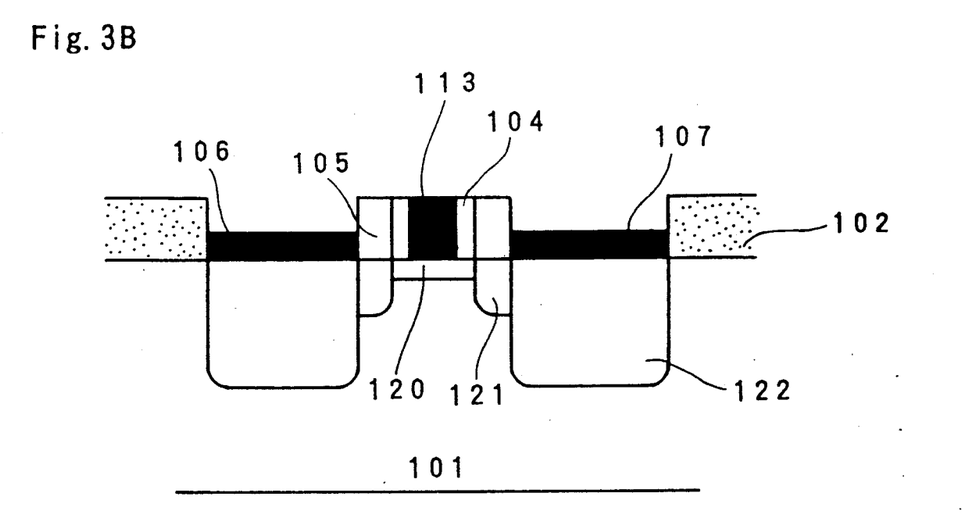

Next, an insulated material for forming the first side wall of the gate electrode 113 (for example, SiO$_2$ (silicon dioxide) or the like) is deposited on the whole surface of the substrate 101, and shaped in the form of the first side wall 104 by anisotropic etching, reminding the insulated material on the side face of the gate electrode 113. Using the gate electrode 113, the first side wall 104 and the insulated layer 102 as masks, a lightly doped layer 121 is formed by ion implantation with self-alignment (FIG. 2C). Furthermore, an insulated material for forming the second side wall of the gate electrode 113 (for example, SiO$_2$ or the like) is deposited on the whole surface, and shaped again in the form of the second side wall 105 by anisotropic etching, reminding the insulated material on the side face of the first side wall. Then, using the gate electrode 113, the first side wall 104, the second side wall 105 and the insulated layer 102 as marks, a heavily doped layer 122 is formed by performing ion implantation with self-alignment (FIG. 3A). Thereafter, in accordance with an ordinary process, ohmic electrodes, namely source electrode 108 and a drain electrode 107 are formed, and MESFET having a LDD structure is completed (FIG. 3B).

In the above-mentioned method, shaping processing of the first side wall 104 and the second side wall 105 is performed by anisotropic etching of SiO$_2$ with RIE. However, in this case, the shape of each side wall is greatly affected by the quality or thickness of the layer of the insulated material forming the side wall, as well as dispersion in etching caused by RIE, and it has been difficult to obtain the same shape with good reproducibility. When the shape of the side wall changes, the shapes of the lightly doped layer 121 and the heavily doped layer 122, forming by the ion implantation using the side wall as a mask change. Therefore, the resultant characteristics of FET greatly change, and it has been an obstacle to obtaining high integration and high yield. Especially in the case of the above-mentioned example, the shaping processing for the side wall has to be performed twice, and this problem has been all the more serious.

Furthermore, there is another problem, in that because anisotropic etching of SiO$_2$ with RIE is used during shaping processing for the first side wall 104 and the second side wall 105, the surface of the semi-insulated compound semiconductor substrate 101, which is exposed at that time, could be damaged by etching. This damage due to etching caused deterioration in characteristics such as in the conductance of FET and reduction in break-down voltage. Especially in the case of the above-mentioned example, the shaping processing for the side wall is performed twice, and this problem is all the more serious.

SUMMARY OF THE INVENTION

An object of the present invention is to solve the above-mentioned problems and provide production methods for compound semiconductor device that is suitable for obtaining high integration and high yield.

It is further object of the present invention to provide a method of making a compound semiconductor device having a field effect transistor structure, comprising the first step of forming a channel layer on a surface of a semiconductor substrate by forming a surface protection layer on said substrate, forming a first resist pattern having an opening in a position corresponding to a element forming area on said surface protection layer, and performing an ion implantation with using the first resist pattern as a mask; the second step of forming a second resist pattern having an opening in a only position corresponding to a gate electrode forming area and thereafter removing said surface protection layer in only a position in which said surface protection layer is exposed through said opening of said second resist pattern the third step of depositing gate electrode material on the whole surface of the substrate to form a gate portion on said channel layer the forth step of etching said second resist pattern with using said gate electrode material as a mask to remove said second resist pattern in a vicinity of said gate portion the fifth step of depositing insulation material on the whole of the substrate to form a gate pattern covering said gate portion and thereafter removing said second resist pattern the sixth step of performing ion implantation to said substrate with using said first resist pattern and gate pattern as masks, to form heavily doped layer and the seventh step of removing said gate pattern by etching, and thereafter performing ion implantation to said substrate with using said gate portion and said first resist pattern as a mask to form a lightly doped layer.

A conventional method in which both sides of the Schottky gate electrode are provided with side walls, which are shaped by etching with RIE to be used as a concretely, in a above method according to the present invention, by using the Schottky gate electrode itself as a mask to perform ion implantation, the lightly doped layers are formed in the heavily doped layers, and by performing ion implantation, using the gate protection layer obtained by the photolithography technology performed once as a mask, the shapes of these layers can be formed uniformly with high accuracy. As a result, high integration and high yield of the above-mentioned MESFET can be achieved. In addition, because the surface of the substrate is always protected by the protection layer, except when the surface protection layer is opened to form the electrode, no damage is caused to the surface during RIE etching. This is also extremely effective for obtaining the above-mentioned high integration and high yield.

It is more further object of the present invention to provide a method of making a compound semiconductor device having a filed effect transistor structure comprising the first step of forming a channel layer in a semiconductor substrate with using a first resist pattern having an opening in a position corresponding an element forming area, thereafter depositing gate electrode material on the substrate, and forming a second resist pattern having an opening in a position corresponding to a gate electrode forming area on said gate electrode material deposited on the substrate the second step of depositing a first insulating material to form a first gate pattern on said gate electrode forming area, and removing said second resist pattern in an area over said gate electrode forming area by etching the third step of depositing a insulating material on the substrate to form a second gate pattern covering said first gate pattern, and thereafter removing all of said resist pattern the forth step of selectively removing said gate electrode material with using said second gate pattern as a mask, and performing ion implantation on the substrate to form heavily doped layer the fifth step of removing said second gate pattern and removing said gate electrode material exposed by removing said second gate pattern with using said first gate pattern as a mask to form a gate portion and the sixth step of performing ion implantation with using said gate portion and said first gate pattern as a mask to form a lightly doped layer.

Concretely, in the above method according to the present invention, the formation of a first gate covering material allows the positioning of a gate electrode and the determination of an area which lightly doped layer should be formed in a substrate.

Further the formation of a second gate covering material allows the determination of an area in which a heavily doped layer should be formed. Because these first and second gate covering material is provided by an opening provided in a mask pattern used for forming gate electrode, the distance between the above layers can be determined in only photolithography process used for forming the gate electrode.

The present invention will become more fully understood from the detailed description given hereinbelow and the accompanying drawings which are given by way of illustration only, and thus are not to be considered as limiting the present invention.

Further scope of applicability of the present invention will become apparent from the detailed description give hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 4A:
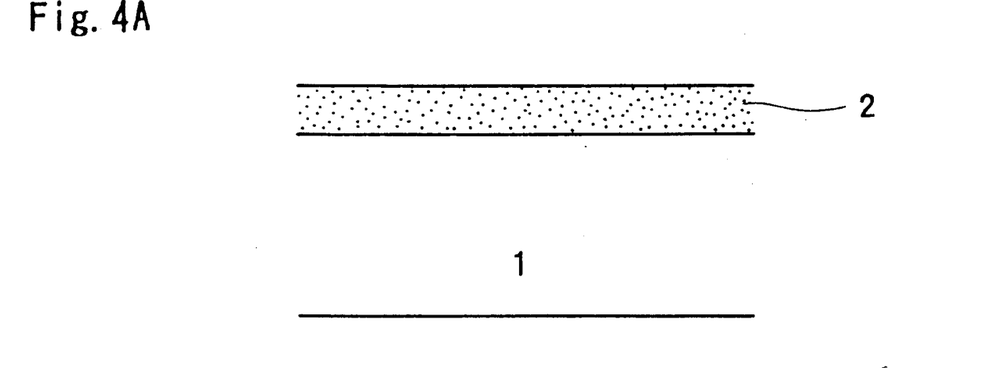
FIG. 4A to FIG. 4D, FIG. 5A to FIG. 5C and FIG. 6A to FIG. 6B show the production steps of the compound semiconductor device according to the present invention.
Figure 4B:
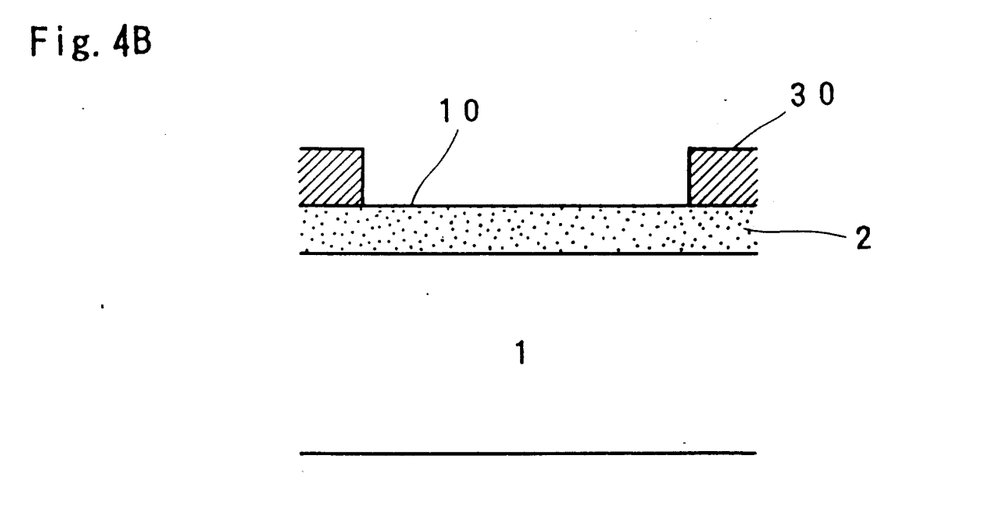
Figure 4C:
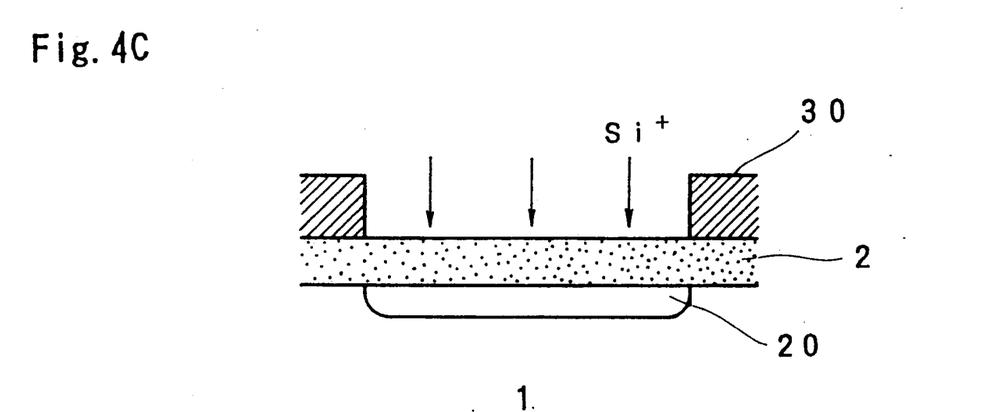

With reference to FIGS. 4A-4D, FIGS. 5A-5C, and FIGS. 6A-6B, a production method of the semiconductor device according to this invention is explained. On a compound semiconductor substrate 1, a surface protection layer 2 comprising, for example, $SiO_2$ is formed (FIG. 4A). Next, a first resist pattern 30 with an opening at the element region 10 is formed by an ordinary photolithography process (FIG. 4B), and ion implantation of Si is performed to form a channel layer 20 (FIG. 4C).

Figure 4D:
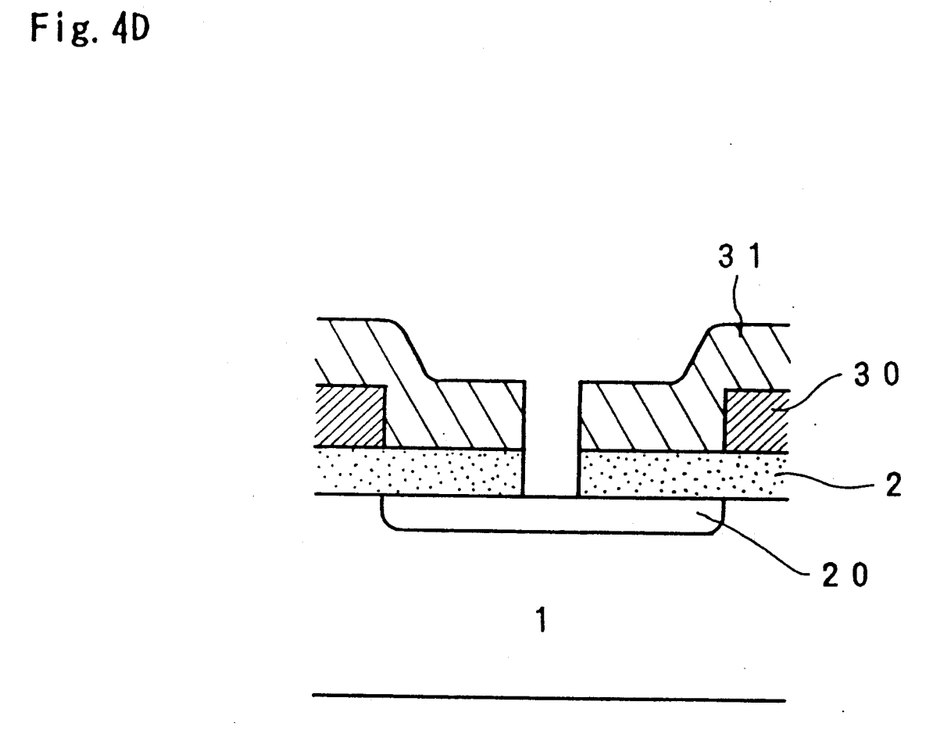

A second resist pattern 31 with an opening only at a portion, where gate electrode is to be formed, is formed remaining the first resist pattern 30 (FIG. 4D) and the surface protection layer 2 is selectively removed by RIE or the like.

Next, a gate electrode material 3 such as tungsten silicide is deposited by sputtering (FIG. 5A), and RIE or the like is performing using this gate electrode material 3 as a mask, to form an under-cut portion 11 in the second resist pattern 31 (FIG. 5B), then a gate portion 13 can be obtained. The size of the under-cut portion 11 determines the spanding between the ends of the gate portion 13 and the heavily doped layer 22 to be formed later.

Next, a gate covering material 81 comprising, for example, SiN is deposited by sputtering. In this case, the gate covering material 81 also spreads around the under-cut portion 11, so that side faces of the gate portion 13 are also covered at the same time (FIG. 5B), and a gate pattern 8 is formed.

Figure 5A:
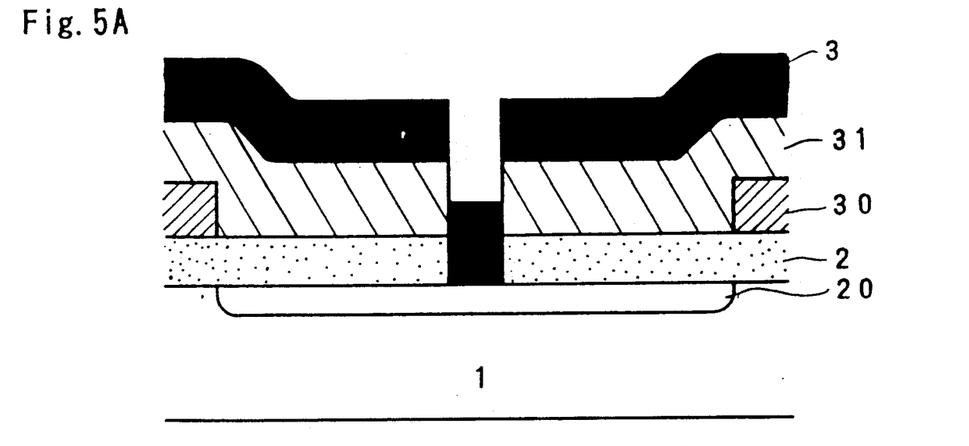
Figure 5B:
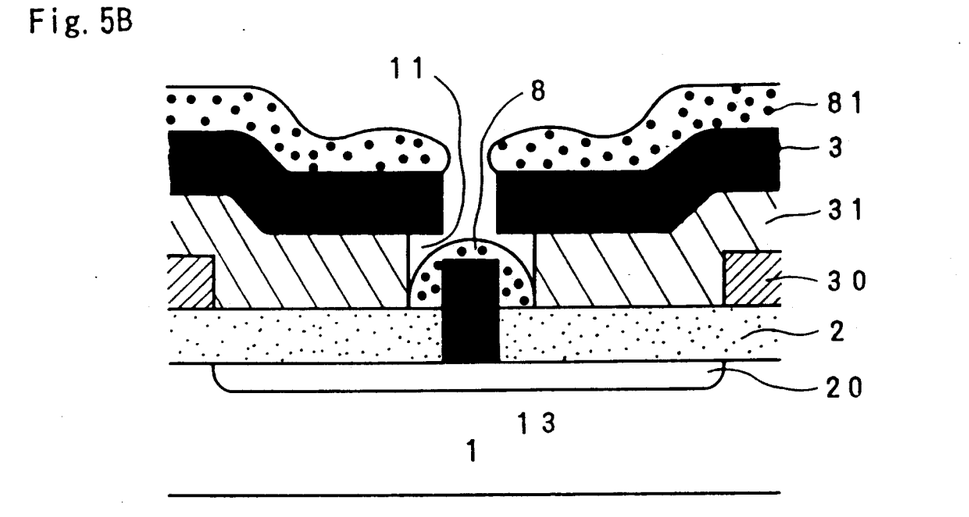
Figure 5C:
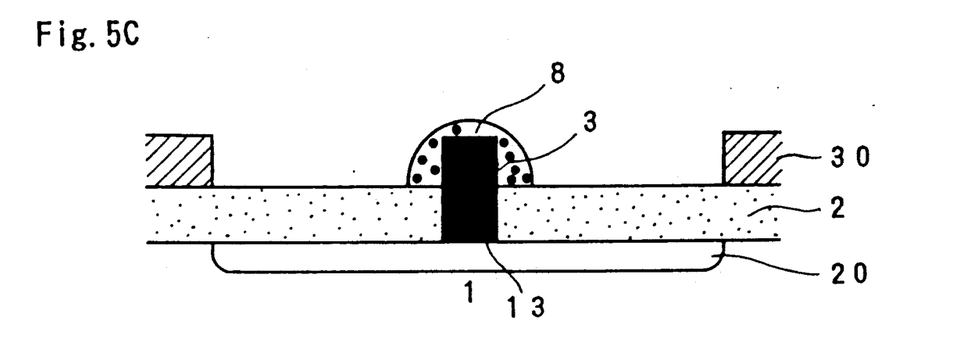
Figure 6A:
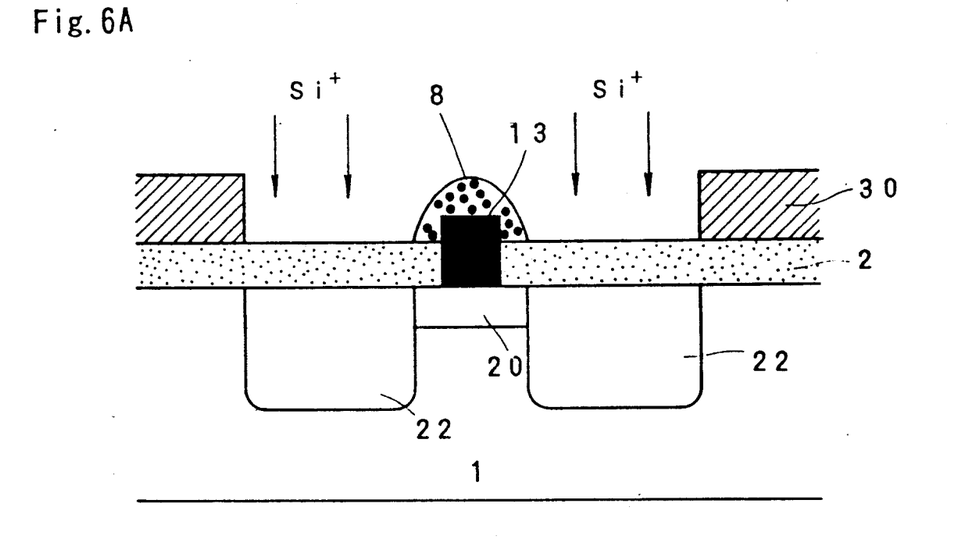

Next, the gate electrode material 3 and the gate covering material 81 are lifted off together with the second resist pattern 31 using acetone or the like (FIG. 5C). In this case, the first resist pattern 30 has experienced baking process two times in order to form the pattern, so it remains exactly as it is without peeling off. In this state, ion implantation for forming heavily doped layers 22 is performed. In this case, ions are not implanted into the compound semiconductor substrate 1 under the region covered with the first resist pattern 30 and the region covered with the gate pattern 8 (FIG. 6A).

Figure 6B:
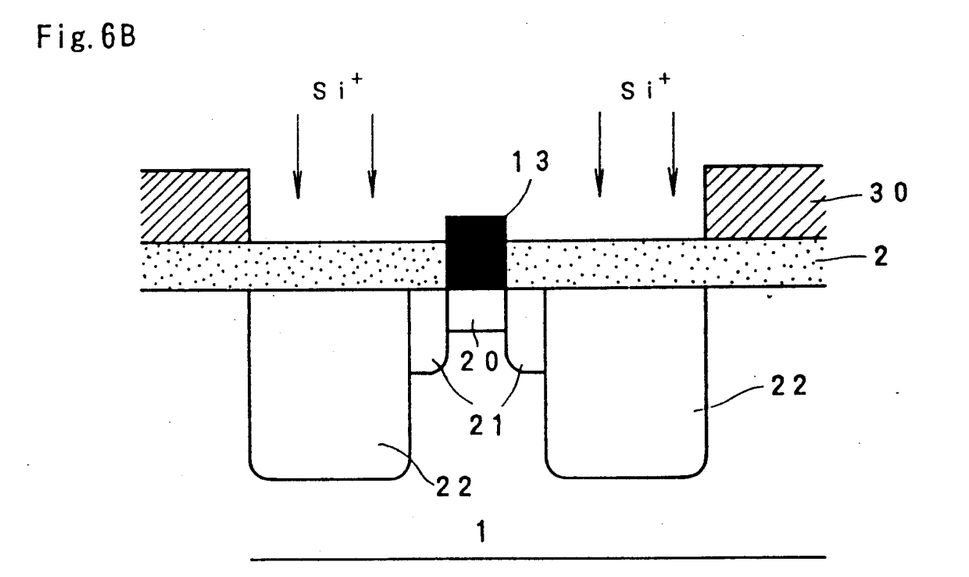
Figure 9:
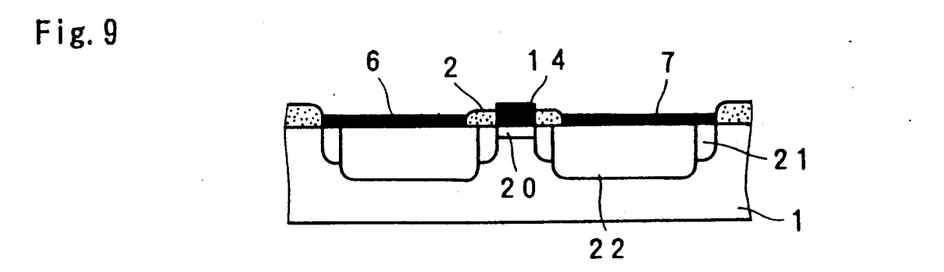
FIG. 9 shows a structure of a compound semiconductor device according to the present invention.

Next, the gate pattern 8 is etched by RIE or the like to remove it, remaining the first resist pattern 30, and ion implantation is performed for forming lightly doped layers 21. In this case, ions are not implanted into the compound semiconductor substrate 1 under the first resist pattern 30 and the gate portion 13, so an LDD structure is provided as shown in FIG. 6B. Next, the first resist pattern 30 is removed by ashing, and activation annealing of the implanted ion is performed under normal conditions. Thereafter, a source electrode 6 and a drain electrode 7 are formed by conventional processes, an FET is completed (FIG. 9).

Incidentally, the above-mentioned example is merely one example, and when the present invention is carried out, various modifications are available. For example, the material for the gate electrode may be metals having a high melting point as represented by molybdenum, tungsten and titanium and silicides thereof or compounds thereof. Furthermore, with respect to the surface protection layer 2 and the gate pattern 8, any combination is available. Especially, it is preferable to use materials whose ratio of etching rate is constant. For example, a material which is removed easier than that for the surface protection layer 2 can be used for the gate pattern 8. In addition, to restrict the short channel effect, an embedded layer containing a P-type impurity may be formed under the channel layer 20, the lightly doped layer 21 and the heavily doped layer 22.

In the production method according to the present invention, the photolithography process, which determines distances between the gate portion 13, the lightly doped layer 21 and the heavily doped layer 22 is performed only once for the pattern of the gate electrode, so that each pattern is formed with excellent accuracy and reproducibility. As a result, it is possible to provide a high performance fine MESFET having a self-aligning LDD structure, and the degree of integration can be improved.

The surface of the above-mentioned semi-insulated compound semiconductor substrate 1 is covered with surface protection layer 2 is etched during formation of the gate portion 13, the source electrode 6 and the drain electrode 7, and etching damage can be minimized. Therefore, deterioration of FET characteristics due to etching damage as observed in the conventional example can be prevented, and reliability can be improved at the same time.

Next, with reference to FIGS. 7A–7E and FIGS. 8A–8D, another production method for the compound semiconductor device according to this invention is explained.

Figure 7A:
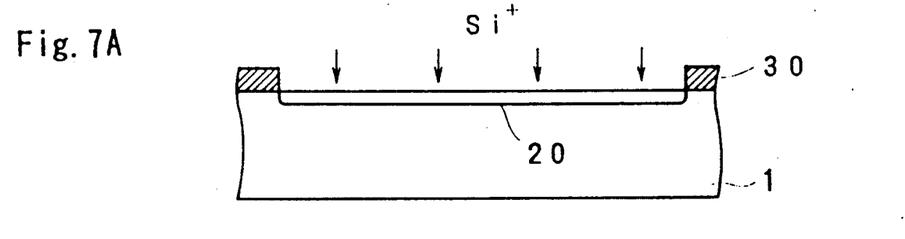
FIG. 7A to FIG. 7E and FIG. 8A to FIG. 8D show other production steps of the compound semiconductor device according to the present invention.

First, on a semiconductor substrate 1 in which semi-insulated GaAs or the like is used, a first resist pattern 30 having an opening at the element forming region of the substrate 1 is formed by means of photolithography. Si ions are implanted into the substrate 1 using the first resist pattern 30 as a mask, and a channel layer 20 is formed (as shown in FIG. 7A).

Figure 7B:
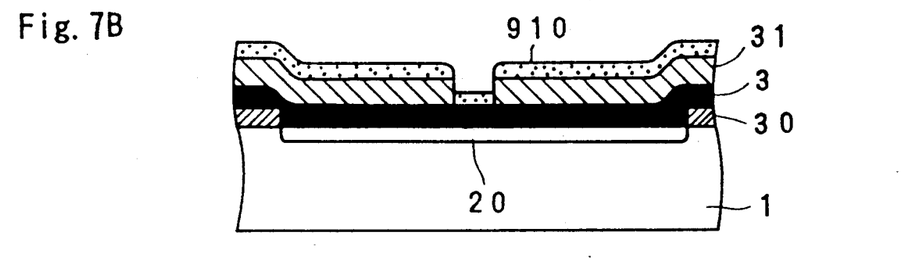

With the first resist pattern 30 remaining as it is, a gate electrode material 3 is deposited over the whole surface by sputtering. As the gate electrode material 3, tungsten silicide is preferable. Furthermore, a second resist pattern 31 having an opening at the gate electrode forming region is formed thereon by photolithography. And then the first gate covering material 910 comprising $SiO_2$ is uniformly deposited on the gate electrode material 3 which is exposed by the opening and on the second resist pattern 31 by sputtering (as shown in FIG. 7B).

Figure 7C:
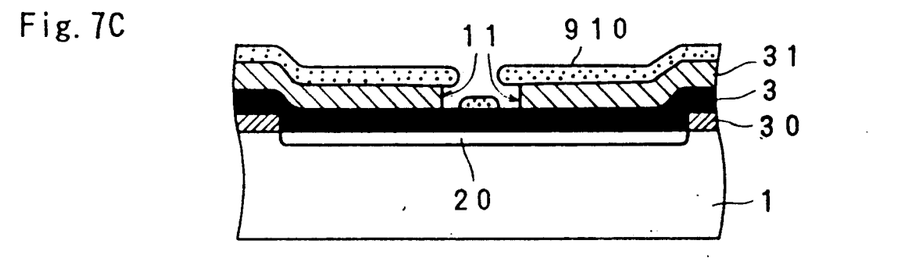

Next, part of the second resist pattern 31 is removed by etching to form an under-cut portion 11 (as shown in FIG. 7C). Therefore, a first gate pattern 91 is formed. This allows the gate electrode material 3 to be exposed in a larger region than the first gate pattern 91. Therefore, this under-cut amount determines the spacing between the end portion of the gate electrode and the heavily doped layer to be formed later.

Figure 7D:
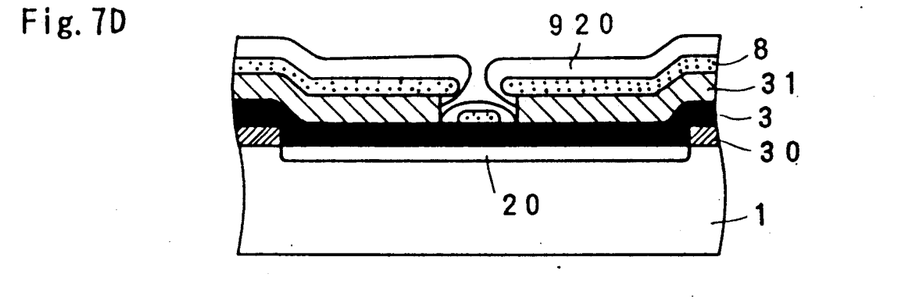

Next, a second gate covering material 920 is deposited on the surface by sputtering. For this second gate covering material 920, a material having an etching speed faster than that of the first gate pattern 91 is used. Here, tungsten silicide has been used. The second gate covering material 920 spreads around the under-cut portion 11 during deposition, so that it has a shape as shown in FIG. 7D.

Figure 7E:
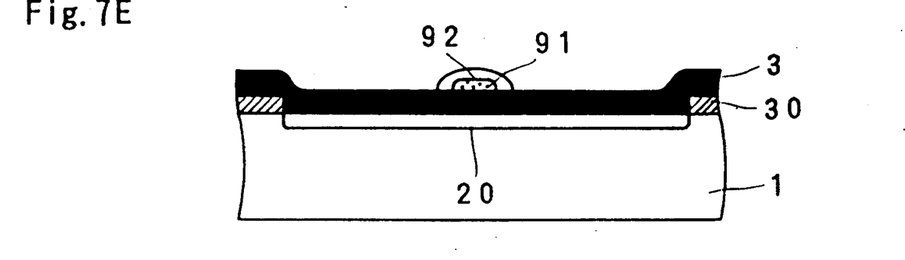

Next, the second resist pattern 31 is removed using the lift-off method, then the second gate pattern 92 is formed. In this case, the first resist pattern 30 is covered with the gate electrode material 3, so that it remains exactly as it is without peeling (as shown in FIG. 7E).

Next, anisotropic etching is performed in this state by the RIE method, and the gate electrode material 3 is selectively removed. In this case, the second gate pattern 92 gradually disappears due to its fast etching speed, however, after the first gate pattern 91 is exposed, the first gate pattern 91 remains due to its extremely slow etching speed. On the other hand, when the gate electrode material 3 being exposed is selectively removed, the presence of the second gate pattern 92 does not allow the gate electrode material 3 just under it to be to etched. In this case, when the gate electrode material 3 has sufficient thickness to act as a mask during ion implantation for forming heavily doped layers 22 in the next step, there is no harmful influence on the gate electrode material 3 other than portions covered with the first gate pattern 91, even if etched to some extent.

Figure 8A:
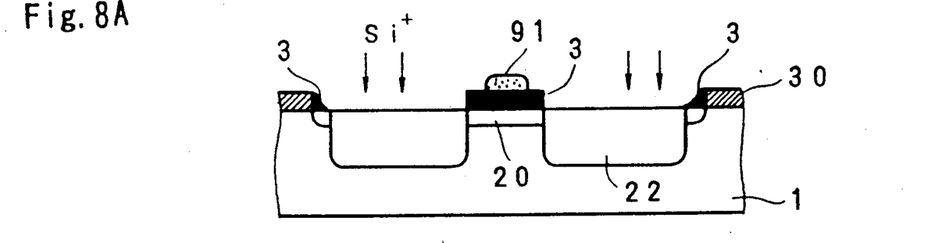

Thereafter Si is implanted by ion implantation into the substrate 1, and the heavily doped layers 22 are formed. In this case, ions are not implanted into the portion of GaAs substrate 1 covered with the gate electrode material 3 and the first resist pattern 30 (as shown in FIG. 8A).

Figure 8B:
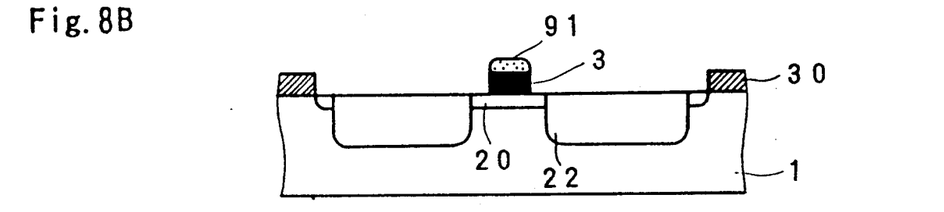

Next, using the first gate pattern 91 as a mask, part of the gate electrode material 3 is removed by the RIE method in order to form a gate portion 13. In this case, the first gate pattern 91 remains on the material forming the gate portion 3, so that no dispersion occurs as it did during processing etching of the side wall of the conventional semiconductor device, and the gate pattern 13 is processed exactly in accordance with the size of the first gate pattern 91, namely exactly in accordance with the size of the opening of the second resist pattern 31 originally formed (as shown in FIG. 8B).

Figure 8C:
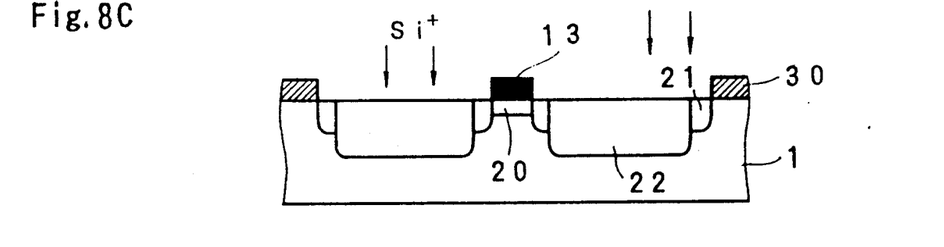

Next, the first gate pattern 91 is removed by the RIE method, and ion implantation of Si into the substrate 1 is performed using the gate portion 13 and the first resist pattern 30 as masks, and lightly doped layers 21 are formed (as shown in FIG. 8C).

Figure 8D:
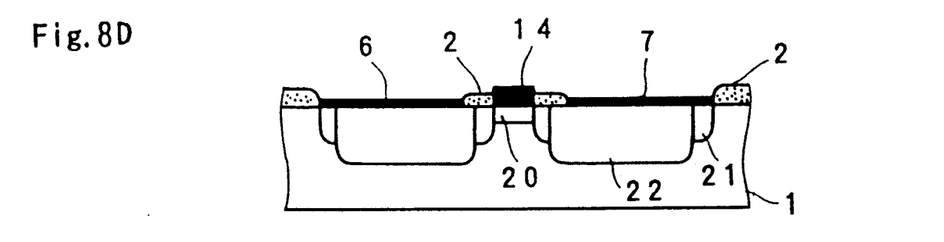

Furthermore, the first resist pattern 30 is removed by ashing to perform annealing, and an insulated layer 2 for separating the element is formed, after which a source electrode 6 and a drain electrode 7 are formed to complete FET (as shown in FIG. 8D).

In the production method according to the present invention, the photolithography process, which determines distances between the gate portion 13, the lightly doped layer 21 and the heavily doped layer 22 is performed only once for the patterning of the gate portion 13, so that each pattern is formed with excellent accuracy and reproducibility.

Incidentally, the above-mentioned example is merely one example, and when the present invention is carried out, various modifications are available. For example, the gate electrode material 3 may be metals having a high melting point as represented by molybdenum, tungsten and titanium and silicides thereof or compounds thereof. Furthermore, with respect to the first gate covering material and the second gate covering material, any combination is available. For example, materials whose ratio of etching rate is constant can be used. Especially, it is pheterafee to use a material, which is etched easier than that for the first gate covering material, for the second gate covering material.

In addition, to restrict the short channel effect, an embedded layer containing a P-type impurity may be formed under the channel layer, the lightly doped layer and the heavily doped layer.

FIG. 9 shows an example of the semiconductor device according to the present invention. At predetermined positions on a compound semiconductor substrate 1 such as, for example, GaAs or the like, a Schottky gate electrode 14 (hereinafter abbreviated as the gate electrode 14) comprising, for example, tungsten silicide, a source electrode 6 and a drain electrode 7 comprising, for example, AuGe/Ni are formed. And on the compound semiconductor substrate 1 other than portions of each of the above-mentioned electrodes, a surface protection layer 2 comprising $SiO_2$ is formed.

In the compound semiconductor substrate 1 under the gate electrode 14, a channel layer 20 having a peak depth of 0.05 $\mu$m and a carrier concentration of $3 \times 10^{17}$ cm$^{-3}$ is formed. At the regions separated 0.25 $\mu$m from both ends of the gate electrode 14 in the horizontal direction, a heavily doped layers 22 having a peak depth of 0.15 $\mu$m and a carrier concentration of $1.5 \times 10^{-}$cm$^{-3}$ are formed.

In addition, on parts of the heavily doped layers 22, a source electrode 6 and a drain electrode 7 are formed. Furthermore, between both ends of the gate electrode 14 and the heavily doped layers 22, a lightly doped layers 21 having a peak depth of 0.08 $\mu$m and a carrier concentration of $8 \times 10^{f}$cm$^{-3}$ are formed.

The difference in the example shown in FIG. 9 from the conventional example in FIG. 1, FIG. 2 and FIG. 3 is the that there is no side wall for the gate electrode, which is essential for forming the lightly doped layer 21 and the heavily doped layer 22, in the conventional example. Therefore, the state of the lightly doped layer 21 and the heavily doped layer 22, which has hitherto been greatly affected by a formed state of the side wall of the gate electrode, becomes extremely stable.

The regions where the gate electrode 13, the lightly doped layers 21 and the heavily doped layers 22 are formed, are determined by the regions forming the first and second gate pattern 91 and 92, and these first and second gate pattern 91 and 92 are further provided by opening of the mask pattern for forming the gate pattern 13. Therefore, distances between each of the above-mentioned layers can be determined solely by the photolithography process for forming the gate portion 13.

As described above, according to the invention, each pattern is formed with excellent accuracy and reproducibility, and it is possible to provide a high performance fine MESFET having a self-aligning LDD structure, and the degree of integration can be improved.

Furthermore, because processing of the side wall of the gate pattern 13 for forming the LDD structure is unnecessary, there is no need to perform anisotropic etching for processing the side wall. Therefore, the conditions in the photolithography process can be maintained constant without change, so that there is no dispersion in FET characteristics, and a compound semiconductor device suitable for obtaining a high yield can be produced.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of making a compound semiconductor device having a field effect transistor structure, comprising:
   a first step of forming a channel layer on a surface of a semiconductor substrate by forming a surface protection layer on said substrate, forming a first resist pattern having an opening in a position corresponding to a element forming area on said surface protection layer, and performing an ion implantation with using a first resist pattern as a mask;
   the second step of forming an second resist pattern having a having an opening in a only position corresponding to a gate electrode forming area and thereafter removing said surface protection layer in only a position in which said surface protection layer is exposed through said opening of said second resist pattern;
   the third step of depositing gate electrode material on the whole surface of the substrate to form a gate portion on said channel layer;
   the forth step of etching said second resist pattern with using said gate electrode material as a mask to remove said second resist pattern in a vicinity of said gate portion;
   the fifth step of depositing insulation material on whole of the substrate to form a gate pattern covering said gate portion and thereafter removing said second resist pattern;
   a sixth step of performing ion implantation to said substrate using said first resist pattern and said gate pattern as masks, to form heavily doped layer; and
   a seventh step of removing said gate pattern by etching, and thereafter performing ion implantation to said substrate using said gate portion and said first resist pattern as a mask to form a lightly doped layer.

2. A method according to claim 1, wherein the etching of said forth step is performed by a reactive ion etching method.

3. A method according to claim 1, wherein the formation of said gate pattern in said fifth step is performed by a sputtering method.

4. A method according to claim 1, wherein said gate pattern is made of a material having a higher etching rate than that of said surface protection layer in an etching process of said seventh step.

5. A method according to claim 1, wherein said surface protection layer is made of Silicon Oxide, and said gate pattern is made of Silicon Nitride.

6. A method according to claim 1, wherein said gate electrode material comprises metal having a high melting point.

7. A method according to claim 1, wherein said gate electrode material comprises metal silicide having a high melting point.

8. A method of making a compound semiconductor device having a field effect transistor structure comprising:
- a first step of forming a channel layer in a semiconductor substrate with using a first resist pattern having an opening in a position corresponding an element forming area, thereafter depositing gate electrode material on the substrate, and forming a second resist pattern having an opening in a position corresponding to a gate electrode forming area on said gate electrode material deposited on the substrate;
- a second step of depositing a first insulating material to form a first gate pattern on said gate electrode forming area, and removing said second resist pattern in an area over said gate electrode forming area by etching;
- a third step of depositing a insulating material on the substrate to form a second gate pattern covering said first gate pattern, and thereafter removing all of said resist pattern;
- a fourth step of selectively removing said gate electrode material with using said second gate pattern as a mask, and performing ion implantation on the substrate to form heavily doped layer;
- a fifth step of removing said second gate pattern and removing said gate electrode material exposed by removing said second gate pattern with using said first gate pattern as a mask to form a gate portion; and
- a sixth step of performing ion implantation with using said gate portion and said first gate pattern as a mask to form a lightly doped layer.

9. A method according to claim 8, wherein the etching of said second step is performed by a reactive ion etching method.

10. A method according to claim 8, wherein the formation of said first and second gate patterns in said second and third steps are performed by a sputtering method.

11. A method according to claim 8, wherein said second gate pattern is made of a material having a higher etching rate than that of said second gate pattern in an etching process of said fifth step.

12. A method according to claim 8, wherein said first gate pattern is made of Silicon Oxide, and said second gate pattern is made of tungsten silicide.

13. A method according to claim 8, wherein said gate electrode material comprises metal having a high melting point.

14. A method according to claim 8, wherein said gate electrode material comprises metal silicide having a high melting point.

* * * * *